United States Patent [19]

Houston et al.

[11] 4,160,679

[45] Jul. 10, 1979

[54] MIGRATION OF FINE LIQUID WIRES BY THERMAL GRADIENT ZONE MELTING THROUGH DOPED SURFACES

[75] Inventors: Douglas E. Houston, Ballston Lake; Harvey E. Cline; Thomas R. Anthony, both of Schenectady, all of N.Y.

[73] Assignee: General Electric Company, Schenectady, N.Y.

[21] Appl. No.: 941,904

[22] Filed: Sep. 13, 1978

[51] Int. Cl.$^2$ .................................... H01L 21/225
[52] U.S. Cl. ................................ 148/1.5; 148/171; 148/178; 148/188
[58] Field of Search ............... 148/1.5, 171, 178, 188

[56] References Cited

U.S. PATENT DOCUMENTS

| | | | |
|---|---|---|---|
| 3,936,319 | 2/1976 | Anthony et al. | 136/89 |
| 3,979,230 | 9/1976 | Anthony et al. | 148/1.5 |
| 3,988,766 | 10/1976 | Anthony et al. | 357/60 |
| 3,988,768 | 10/1976 | Anthony et al. | 357/60 |
| 4,006,040 | 2/1977 | Cline et al. | 148/171 X |
| 4,010,534 | 3/1977 | Anthony et al. | 29/572 |
| 4,021,269 | 5/1977 | Anthony et al. | 148/187 X |
| 4,032,364 | 6/1977 | Anthony et al. | 148/188 X |

Primary Examiner—G. Ozaki
Attorney, Agent, or Firm—Donald M. Winegar; Joseph T. Cohen; Charles T. Watts

[57] ABSTRACT

Uniform initiation and migration of fine liquid wires by thermal gradient zone melting processing through a solid body of semiconductor material is enhanced by a heavily doped region of the body which includes the surface of initiation of the migration.

9 Claims, No Drawings

MIGRATION OF FINE LIQUID WIRES BY THERMAL GRADIENT ZONE MELTING THROUGH DOPED SURFACES

BACKGROUND OF THE INVENTION

Field of the Invention

This invention relates to a method of migrating a melt of a metal through a solid body of semiconductor material by thermal gradient zone melting (TGZM) and, in particular, to the uniform initiation of migration by enhancing the penetration of melts into the material at the surface when fine liquid lines or small diameter liquid droplets are being migrated.

Description of the Prior Art

W. G. Pfann in U.S. Pat. Nos. 2,739,088 and 2,813,048 describes methods for practicing the movement of melts of metal through particular regions of a solid body of semiconductor material by thermal gradient zone melting. However, molten line and droplet in stability resulted in the breakup of the migrating lines and droplets and consequently acceptable semiconductor devices were not always obtainable.

Recently, we discovered that preferred planar orientation of the surfaces of the body of semiconductor material, migration axis and line orientation axis relationship were also a necessity to migrate liquid metal wires and/or droplets through the solid body. (See U.S. Pat. Nos. 3,899,362 and 3,904,442, for example). These improvements in TGZM resulted in commercialization of the process. However, as the width of the lines being migrated became smaller, the penetration of fine liquid lines of less than 2 mils in width, and preferably 1 mil in width, and small liquid droplets, less than 6 mils in diameter, from the surface of a wafer or body of semiconductor material has been difficult to achieve repeatedly, on a commercial basis, by a thermal gradient alone. At wire sizes less than 30 microns it becomes difficult to migrate in a straight path and so produce straight uniformly doped trails particularly at temperatures below 1000° C. One reason noted for this difficulty is that the migration direction deviates from the applied thermal gradient in the surface region of the body where migration is initiated. Although the thermal gradient is strong enough to cause migration of the small liquid zones once they are formed in the bulk of semiconductor material, the thermal gradient force is not powerful enough to overcome the surface tension forces holding fine liquid zones, or wires, on the surface of a body, or wafer. Further improvements to the TGZM processing techniques included alloying the deposited metal to the surface (U.S. Pat. No. 3,897,277) and sintering of the same (U.S. Pat. No. 4,006,040). The problem still persists as one attempts to migrate fine lines and droplets on a commercial basis. As a result, TGZM to date has been limited to line and droplet dimensions typical of solid-state power device isolation grids and has not had any commercial impact on integrated-circuit type devices which require a much finer size of doped region.

Presently the preferred source of radiant energy for practicing thermal gradient zone melting is infrared lamps. The major surface on which the metal layer to be migrated is deposited is exposed to the heat sink. The other major surface is exposed to the infrared lamps. The radiant energy is directed onto that major surface, travels through the wafer, or body, and is emitted at the other major surface where the metal is deposited. The body is almost transparent to much of the radiant energy of the lamps. Consequently, the region of the body, including the major surface with the metal deposit, has substantially no thermal gradient therein in the vertical direction necessary for migration. Therefore, although the radiant energy heats the body sufficiently to melt the metal, little if any penetration of the melt into the surface may occur and migration is sluggish, if at all. Therefore any lateral gradients present in the body will affect the initiation and/or vertical melt migration. In the region of almost no vertical thermal gradient, the effect becomes more pronounced as the wire lines become smaller in width, and initiation of vertical melt migration may never occur. In migrating grids for some discrete devices, the wire lines migrated are of the order of 250 microns. Consequently, the effect of little or no vertical thermal gradient in the affected region is little noticed.

Fine liquid wires of less than 10 microns and droplets of less than 100 microns in diameter experience difficulty in penetration and initial migration. If a lateral thermal gradient is present, the fine line or droplet may slide along the surface until vertical melt migration occurs. Should vertical melt initiation occur, melt migration may still proceed off-axis to the vertical gradient under the influence of the lateral gradient. After awhile, vertical gradient becomes the dominant influence and migration proceeds substantially vertical to the two opposed major surfaces.

Therefore, it is an object of this invention to provide a new and improved method to migrate fine molten lines and droplets of metal through a solid body of semiconductor material by thermal gradient zone melting (TGZM) processing which overcomes the deficiencies of the prior art.

Another object of this invention is to provide a new and improved method for initiating the penetration of fine molten metal wires and droplets into the surface region of a solid body for migration therethrough by TGZM by providing a heavily doped region in the body which includes the surface from which initiation of the melt is practiced.

A further object of this invention is to provide a new and improved method for maintaining the thermal gradient through the entire body to keep the melt migration velocity essentially constant.

Other objects of this invention will, in part, be obvious and will, in part, appear hereinafter.

BRIEF DESCRIPTION OF THE INVENTION

In accordance with the teachings of this invention, there is provided an improvement in the method of moving a melt of a metal-rich semiconductor material through a solid body of metal-rich semiconductor material by temperature gradient zone melting. The improvement consists of forming a region in the body to increase the emissivity over a wider range of the radient energy in that portion of the body. This region includes the selected surface of preferred planar crystal orientation on which the metal to be migrated is deposited.

This region is preferably found by diffusion and has a thickness which is determined by the melt migration temperature, the dopant impurity material of the region and the initial dopant impurity concentration of the body. For silicon wafers, or bodies, migration temperatures may vary from 700° C. to 1400° C. and the emitted wavelength varies from 3.00 microns at 700° C. to 1.72 microns at 1400° C. The affected region must therefore be doped to a required impurity concentration to achieve less than 1 micron of penetration of the radiation in order to maintain a unidirectional thermal gradient across the affected region normal to the selected surface. When the affected region is gallium doped, solid solubility of gallium in silicon dictates that the thickness thereof is 23 microns minimum and the dopant impurity concentration is $6 \times 10^{19}$ atoms/cc. When the affected region is arsenic doped, for which the solid solubility in Si is higher, the thickness thereof is 0.7 micron and the dopant impurity concentration is $2 \times 10^{21}$ atoms/cc.

The desired region may be of any type of conductivity for whatever metal to be migrated.

DESCRIPTION OF THE INVENTION

A body of semiconductor material is selected for a particular level of resistivity and a first type conductivity. The body has opposed major surfaces which are the top and bottom surfaces respectively thereof. The semiconductor material comprising the body may be silicon, germanium, silicon carbide, gallium arsenide, a compound of a Group II element and a Group VI element, and a compound of a Group III and a Group V element.

The thermal migration of metal wires is preferably practiced in accordance with the planar orientation, thermal migration directions, stable wire directions and stable wire sizes of the following Table I.

<$100$> crystal axis direction as an irregular pyramid with a diamond base.

In order to describe the invention more fully, and for no other reason, the body, or wafer, will be said to be of silicon semiconductor material. The preferred planar crystal orientation having been selected, the body is prepared by standard semiconductor processing techniques for a diffusion operation to dope the region of body which includes the major surface upon which the metal to be migrated is to be deposited, as well as the exit surface. The dopant concentration and depth of diffusion obtained by the drive cycle is determined by the dopant material, the initial dopant concentration of the body and the temperature at which thermal migration is to be practiced. The source of radiant energy is, at this time, immaterial. The following Table II tabulates the various parameters for TGZM processing of silicon bodies or wafers. The preferred N type dopant for TGZM processing is arsenic because of its relatively high solubility in silicon. Likewise for P-type doping for TGZM processing, gallium is the preferred dopant impurity material because of its relatively high solubility in silicon. Other dopant materials can be utilized for forcing the doped region to aid TGZM processing but because of their lower solubility in silicon, the region must be deeper in order to compensate for the lesser quantity of dopant material per unit volume. This results in a weakening of the vertical gradient where it is required for the initiation of vertical melt migration to occur.

TABLE II

| Migration Temp. | Emitted Wavelength of Affected Region in microns | Doping Level to Achieve Less than 1 μm Penetration of Radiation atoms/cc × $10^{21}$ | Maximum Concentration atoms/cc × $10^{19}$ Ga | Depth of Diffused Region Required Microns Ga | Maximum Concentration atoms/cc × $10^{21}$ As | Depth of Diffused Region Required Microns As |
|---|---|---|---|---|---|---|
| 700° C. | 3.00 |  | 6 | 23 | 2 | 0.7 |
| 800° C. | 2.70 | 1.00 | 6 | 23 | 2 | 0.7 |
| 900° C. | 2.45 | 1.05 | 6 | 23 | 2 | 0.7 |
| 1000° C. | 2.27 | 1.11 | 6 | 23 | 2 | 0.7 |
| 1100° C. | 1.10 | 1.16 | 6 | 23 | 2 | 0.7 |
| 1200° C. | 1.96 | 1.22 | 6 | 23 | 2 | 0.7 |
| 1300° C. | 1.84 | 1.28 | 6 | 23 | 2 | 0.7 |
| 1400° C. | 1.72 | 1.40 | 6 |  |  |  |

| Wafer Plane | Migration Direction | Stable Wire Directions | Stable Wire Sizes |
|---|---|---|---|
| (100) | <100> | <011>* | <100 microns |
|  |  | <011>* | <100 microns |
| (100) | <110> | <110>* | <150 microns |
| (111) | <111> | a) <011> |  |
|  |  | <101> | <500 microns |
|  |  | <110> |  |
|  |  | b) <112>* |  |
|  |  | <211>* | <500 microns |
|  |  | <121> |  |
|  |  | c) Any other* direction in (111) plane | <500 microns |

*The stability of migrating wire is sensitive to the alignment of the thermal gradient with the <100>, <110> and <111> axis, respectively.
*Group a is more stable than group b which is more stable than group c.

Droplets are migrated in the migration direction. The shape of the droplets is determined by the wafer plane orientation and migration direction. In a crystal axis direction of <111> of thermal migration, the droplet migrates in a triangular platelet laying in a (111) plane. A droplet migrated in the <100> crystal axis direction as a regular pyramid bounded by four forward (111) planes and a rear (100) plane. A droplet migrates in the The doped region absorbs the radiation emitted from within the semiconductor body and radiates this energy both internally within the semiconductor and externally to the cooled heat sink. The backward radiation decreases the amount of heat transfer from within the semiconductor by radiation and thereby enhances the thermal gradient within the semiconductor body under the doped surface layer. However, the magnitude of the thermal gradient decreases within the doped layer itself since there is a net heat transfer by radiation from within this region to the external heat sink. It is therefore advantageous to keep the doped surface layer as thin as possible. The unidirectional thermal gradient is an extension of the desired unidirectional thermal gradient already established in the body. The melt is now uniformly heated, penetrates the major surface into the body and migrates substantially perpendicular to the two opposed major surfaces. For all intents and purposes the migration is perpendicular to the opposed major surfaces and parallel to the vertical axis of the body. Migration may, however, be either parallel to a preferred crystal axis of migration or at an off-axis orientation of from 2° to 10°.

As noted in the table, the selection of the dopant impurity metal determines the thickness of the region required to establish the uniform thermal gradient across the entire thickness of the body. For example, an arsenic doped region may be very heavily doped and requires a thickness of only 0.7 microns, while a gallium doped region requires a thickness of 23 microns. Either one, or other type of metal doped regions such as aluminum, boron, phosphorus, and the like may be used. It depends solely upon what one can tolerate as to type of dopant and thickness of wafer and processing requirements.

After formation of the doped region, the surface of the body of semiconductor material is prepared by usual semiconductor processing techniques for deposition of the metal to be migrated through the solid body of material. The metal may be deposited by any suitable means on the surface of initiation of melt migration. For example, when the body is of N-Type silicon semiconductor material and the melt to be migrated comprises, at least in part, aluminum, it has been discovered that the vapor deposition of the layer of aluminum metal should be performed at a pressure of approximately $1 \times 10^{-5}$ torr but not greater than $5 \times 10^{-5}$ torr. When the pressure is greater than $5 \times 10^{-5}$ torr, we have found that in the case of aluminum metal vapor deposited, the aluminum does not easily penetrate into the silicon and migrate through the body. It is believed that the layer of aluminum is saturated with oxygen and prevents reduction by the aluminum metal of the very thin silicon oxide layer between the deposited aluminum and the silicon. Thus, the initial melt of aluminum and silicon required for migration is not obtained because of the inability of the aluminum layer to wet and alloy with the underlaying silicon. In a similar manner, the aluminum deposited by sputtering is not as desirable as sputtered aluminum appears to be saturated with oxygen from the sputtering process, thereby preventing the reduction of any intervening silicon oxide. The preferred methods of depositing aluminum on the silicon body are by the electron beam method and the like wherein little, if any, oxygen can be trapped in the aluminum.

The apparatus for, and the usual process of, temperature gradient zone melting process is not a part of this invention. For a more thorough understanding of the temperature gradient zone melting process employed in this invention and for a more thorough description of the apparatus employed for this process, one is directed to the following U.S. Patents entitled Method of Making Deep Diodes, No. 3,901,736; Deep Diode Device and Method, No. 3,902,925; Deep Diode Devices and Method and Apparatus, No. 4,091,257; High Velocity Thermomigration Method of Making Deep Diodes, No. 3,898,106. The Stabilized Droplet Method of Making Deep Diodes Having Uniform Electrical Properties, No. 3,898,361; Method of Making Isolation Grids in Bodies of Semiconductor Material, No. 3,979,230; and Thermomigration of Metal-Rich Liquid Wires Through Semiconductor Materials, No. 3,899,362.

The processed wafer, or body, is placed in the thermal gradient zone melting apparatus, with the major surface having the deposited metal thereon closest to the cold heat sink. A unidirectional thermal gradient is established substantially parallel to the vertical axis and perpendicular to the two opposed major surfaces. The thermal gradient may be parallel to a prepared crystal axis of the body or may be from 2° to 10° off that preferred crystal axis. The off-axis unidirectional thermal gradient may be achieved by cutting the wafer off axis.

Upon completion of processing by thermal gradient zone melting the wafer is now ready for further processing to make a completed semiconductor device.

When heating by radiation, the exit surface region has a reduced thermal gradient which results from the partial transparency of the semiconductor material to radiant energy source. Therefore, one should preferably form a doped region at the exit surface also to maintain the thermal gradient through the entire body or wafer to keep the melt migration velocity essentially constant. The doped region at the exit surface has the same characteristics as that doped region at the surface of initiation and is formed in the same manner as, or simultaneously with that region.

Our experiments have continually shown that the increased emissivity of the one or more doped regions enhances the establishment of the unidirectional thermal gradient across the entire thickness of the body and improves the resolution of the thermal migration process.

We claim as our invention:

1. In the method of moving a melt of metal-rich semiconductor material through a solid body of semiconductor material by thermal gradient zone melting processing comprising the step of
   a. selecting a body of single crystal semiconductor material so that the body has a first type conductivity, a selected resistivity, and at least one of two major opposed surfaces having a preferred planar crystal structure orientation which is one selected from the group consisting of (100), (110) and (111), the vertical axis of the body being substantially aligned with a first axis of the crystal structure, the surface having the preferred planar crystal structure orientation to accommodate one or more physical configurations of a layer of metal thereon;
   b. depositing a layer of metal on the selected surface of the body of semiconductor material;
   c. heating the body and the layer of metal to a temperature sufficient to form a melt of metal-rich material on the surface of the body;
   d. establishing a temperature gradient along substantially the vertical axis of the body and the first axis of the crystal structure, and
   e. migrating the metal-rich melt through the body parallel to the vertical axis of the body to form within the body at least one region of recrystallized material of the body having solid solubility of the vapor deposited metal therein, the metal including at least one dopant impurity material therein to impart a second type conductivity and a selected level of resistivity thereto;

the improvement in the method of processing which includes prior to depositing the layer of metal on the selected surface the additional process step of forming a region in the body to increase the emissivity of the radiant energy in that portion of the body including the region, and to maintain the unidirectional thermal gradient to be established in the body normal to the selected surface in that region of the body, including the selected surface thereof on which the layer of metal is to be deposited, the region extending a predetermined depth into the body from the selected surface to provide a minimum thickness thereto and having a predetermined level of concentration of a dopant impurity material therein.

2. The method of claim 1 wherein
the semiconductor material is silicon,
the dopant impurity material of the region of increased emissivity is gallium having a concentration of $6 \times 10^{19}$ atoms/cc, and,
the minimum thickness of the region of increased emissivity is 23 microns.

3. The method of claim 1 wherein
the semiconductor material is silicon,
the dopant impurity material of the region of increased emissivity is arsenic having a concentration of $2 \times 10^{21}$ atoms/cc, and
the minimum thickness of the region of increased emissivity is 0.7 micron.

4. The method of claim 1 and further including forming two regions to increase the emissivity of the radiant energy in that portion of the body, one region including the selected surface thereof on which the layer of metal is to be deposited and the second region including selected surface area of the other major surface through which the migrating metal-rich melt exits the body.

5. The method of claim 4 wherein
two regions are formed simultaneously.

6. The method of claim 5 wherein
the semiconductor material is silicon,
the dopant impurity material of the region of increased emissivity is gallium having a concentration of $6 \times 10^{19}$ atoms/cc, and
the minimum thickness of the region of increased emissivity is 23 microns.

7. The method of claim 5 wherein
the semiconductor material is silicon,
the dopant impurity material of the region of increased emissivity is arsenic having a concentration of $2 \times 10^{21}$ atoms/cc, and
the minimum thickness of the region of increased emissivity is 0.7 micron.

8. The method of claim 4 wherein
the semiconductor material is silicon,
the dopant impurity material of the region of increased emissivity is gallium having a concentration of $6 \times 10^{19}$ atoms/cc, and
the minimum thickness of the region of increased emissivity is 23 microns.

9. The method of claim 4 wherein
the semiconductor material is silicon,
the dopant impurity material of the region of increased emissivity is arsenic having a concentration of $2 \times 10^{21}$ atoms/cc, and
the minimum thickness of the region of increased emissivity is 0.7 micron.

* * * * *